United States Patent
Hayashide et al.

(10) Patent No.: US 6,914,011 B2
(45) Date of Patent: Jul. 5, 2005

(54) FILM DEPOSITION SYSTEM AND METHOD OF FABRICATING SEMICONDUCTOR DEVICE EMPLOYING THE FILM DEPOSITION SYSTEM

(75) Inventors: Yoshio Hayashide, Hyogo (JP); Kazuo Kobayashi, Hyogo (JP); Yasufumi Morimoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 91 days.

(21) Appl. No.: 10/640,331

(22) Filed: Aug. 14, 2003

(65) Prior Publication Data

US 2004/0163599 A1 Aug. 26, 2004

(30) Foreign Application Priority Data

Feb. 26, 2003 (JP) .................................... 2003-049361

(51) Int. Cl.⁷ ................................................ H01L 21/31
(52) U.S. Cl. ...................................... 438/758; 118/715
(58) Field of Search .......................... 438/758; 118/715

(56) References Cited

U.S. PATENT DOCUMENTS 6,130,118 A * 10/2000 Yamazaki .................... 438/151
6,152,071 A * 11/2000 Akiyama et al. ........ 118/723 VE
6,200,911 B1 * 3/2001 Narwankar et al. .......... 438/758
6,403,479 B1 * 6/2002 Watanabe et al. ........... 438/680
6,579,811 B2 * 6/2003 Narwankar et al. .......... 438/758
6,656,838 B2 * 12/2003 Watanabe et al. ........... 438/680
6,833,322 B2 * 12/2004 Anderson et al. ........... 438/680

FOREIGN PATENT DOCUMENTS

| JP | 62-44574 | 2/1987 |
| JP | 8-213379 | 8/1996 |
| JP | 9-275077 | 10/1997 |

* cited by examiner

Primary Examiner—Michael S. Lebentritt
Assistant Examiner—Olivia T. Luk
(74) Attorney, Agent, or Firm—McDermott Will & Emery LLP (57) ABSTRACT

A film deposition system comprises a chamber having an internal space, a support part provided in the internal space of the chamber for supporting a substrate, a gas supply part supplying gas to the internal space and a heating part heating the substrate. After an oxide film is formed on the substrate, the gas supply part supplies oxygen or a gas mixture of oxygen and ozone to the internal space while the heating part heats the substrate. Thus provided is a film deposition system capable of flattening an oxide film.

9 Claims, 13 Drawing Sheets

FILM DEPOSITION SYSTEM AND METHOD OF FABRICATING SEMICONDUCTOR DEVICE EMPLOYING THE FILM DEPOSITION SYSTEM

BACKGROUND OF THE INVENTION

1. Field of the Invention

The present invention relates to a film deposition system and a method of fabricating a semiconductor device employing the film deposition system, and more particularly, it relates to a chemical vapor deposition (CVD) system forming an oxide film on a semiconductor substrate and a method of fabricating a semiconductor device employing this system.

2. Description of the Background Art

In general, Japanese Patent Laying-Open Nos. 8-213379 (1996), 62-44574 (1987) and 9-275077 (1997), for example, disclose film deposition systems.

A semiconductor device formed on a semiconductor substrate has recently been refined, followed by refinement of elements such as gate electrodes forming the semiconductor device. In the process of such refinement, the interval between the gate electrodes is also narrowed. When an oxide film, for example, is formed on such gate electrodes formed at a narrow interval, voids do not disappear but remain in the oxide film even if the oxide film is heat-treated. When chemical mechanical polishing (CMP) is performed in this state for flattening the oxide film, grooves resulting from the voids are formed in the oxide film. These grooves result in short-circuit of wires or a failure in pattern formation in a later step. In order to avoid this problem, flowability with respect to heat treatment can be improved by increasing the concentration of boron or phosphorus contained in the oxide film. In this case, however, the oxide film is disadvantageously unstabilized to result in a deposit or cracking. While flowability can also be improved by increasing the time for the heat treatment, high-temperature long-term heat treatment exerts bad influence on the refined device.

While a conventional wafer of 200 mm in diameter has recently been replaced with a wafer of 300 mm in diameter, the peripheral or central portion of such a large-diametral wafer may be separated from the surface of a heater due to warping of the wafer. This results in temperature reduction in the portion separated from the heater, to damage in-plane uniformity of the film thickness and impurity concentration. In order to overcome this problem, the heater may be provided with a vacuum suction mechanism or an electrostatic suction mechanism for bringing the bent wafer into close contact with the heater. However, it is difficult to implement this as to the heater used under a high temperature of at least 400° C. in view of restriction in material. Thus, it is generally difficult to form an interlayer dielectric film on gates due to the large diameter and refinement of the device.

SUMMARY OF THE INVENTION

The present invention has been proposed in order to solve the aforementioned problems, and an object thereof is to provide a method of uniformly forming a film of high quality also on a large-diametral wafer closely between trenches, gates or wires provided at a fine isolation width and a film deposition system for enabling such formation of the film.

A film deposition system according to the present invention comprises a chamber having an internal space, a support part provided in the internal space of the chamber for supporting a substrate having a first main surface formed with a film and a second main surface opposite to the first main surface, a gas supply part supplying gas to the internal space, a heating part heating the second main surface of the substrate with a lamp or the like and a pressure regulating part increasing the pressure of a part of the internal space closer to the first main surface beyond the pressure of another part closer to the second main surface for bringing the substrate into close contact with the support part. The support part supports the outer peripheral portion or the outer peripheral portion and the central portion of the substrate to expose the first and second main surfaces in the internal space. The term "the outer peripheral portion of the substrate" denotes a portion of the substrate at a distance of at least 0.8R and not more than R from the center thereof assuming that R represents the radius of the substrate. The term "the central portion of the substrate" denotes a portion of the substrate at a distance of at least 0 and not more than 0.2R from the center thereof assuming that R represents the radius of the substrate.

The film deposition system having the aforementioned structure, heating the second main surface of the substrate with the heating part employing a lamp or the like, can uniformly heat the substrate regardless of warping thereof. Thus, a film can be uniformly deposited also when the substrate has a large diameter.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings. In the following embodiments, identical or corresponding portions are denoted by the same reference numerals, and redundant description is not repeated.

(First Embodiment)

Figure 1:
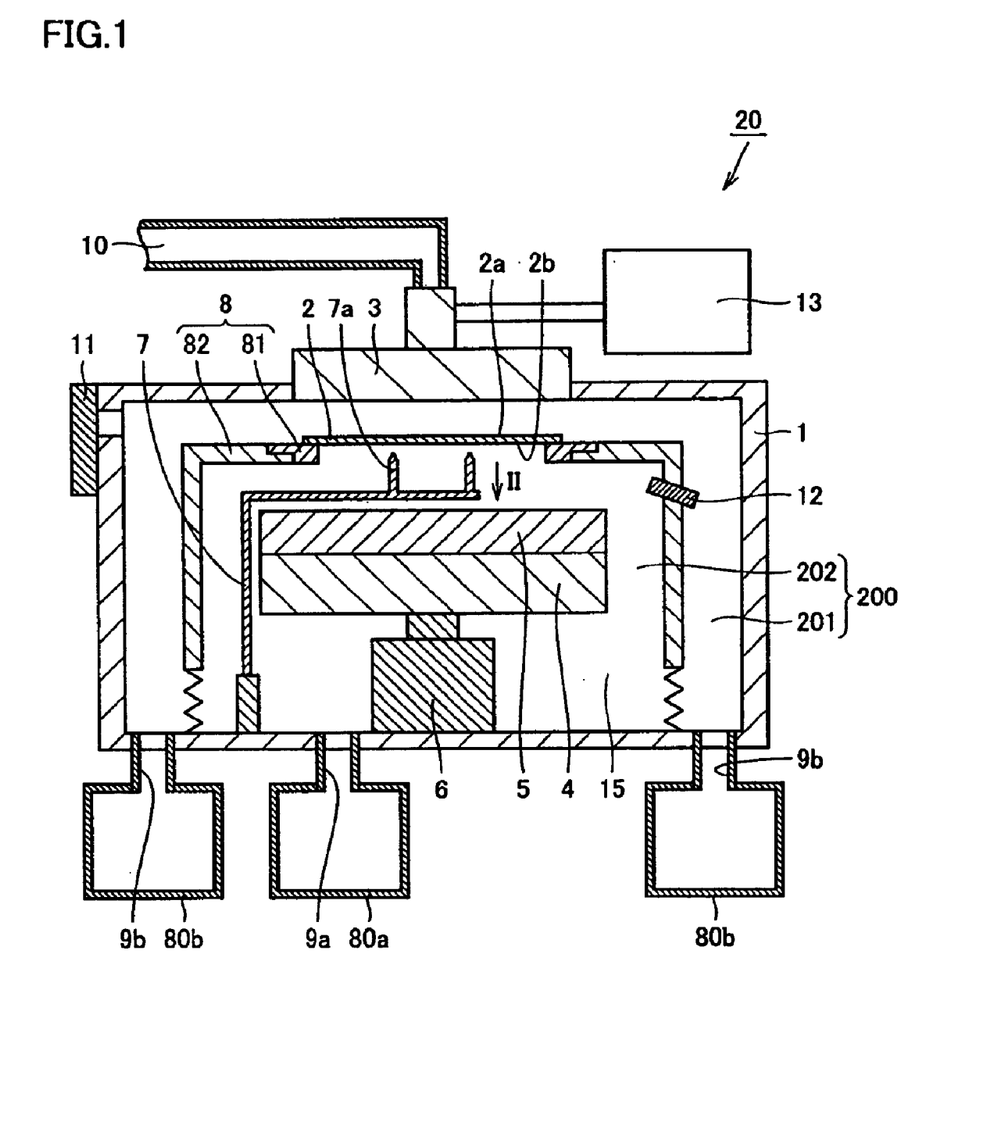
FIG. 1 is a sectional view of a film deposition system according to a first embodiment of the present invention.

Referring to FIG. 1, a film deposition system 20 according to a first embodiment of the present invention comprises a chamber 1 having an internal space 200, a support part 8 provided in the internal space 200 of the chamber 1 for serving as a pedestal supporting the outer peripheral portion of a substrate 2, a gas supply part 3 serving as a gas head supplying gas to the internal space 200 and a heating part 4 heating the substrate 2 with a lamp or the like. After an oxide film is formed on the substrate 2, the gas supply part 3 supplies oxygen or a gas mixture of oxygen and ozone to the internal space 200 while the heating part 4 heats the substrate 2. The support part 8, supporting only the outer peripheral portion of the substrate 2 in this embodiment, may alternatively support only the central portion and the outer peripheral portion of the substrate 2.

The substrate 2 has a first main surface 2a formed with a film and a second main surface 2b opposite to the first main surface 2a. The film deposition system 20 further comprises pressure regulating parts 80a and 80b increasing the pressure in a part of the internal space 200 closer to the first main surface 2a beyond that in another part closer to the second main surface 2b for bringing the substrate 2 into close contact with the support part 8.

The pressure regulating parts 80a and 80b keep the pressure in the part of the internal space 200 closer to the first main surface 2a at least 10000 Pa.

The support part 8 divides the internal space 200 into a first space 201 closer to the first main surface 2a and a second space 202 closer to the second main surface 2b. The support part 8 supports the substrate 2 to expose the first and second main surfaces 2a and 2b in the internal space 200.

The film deposition system 20 comprises the gas supply part 3 provided in the chamber 1 for serving as the gas head spraying source gas to the substrate 2 which is a wafer, the heating part 4 serving as a light source for heating the substrate 2, a collimator 5 converting a beam emitted from the heating part 4 to a component perpendicular to the substrate 2, an actuator 6 for rotating or horizontally moving the heating part 4 and the collimator 5, a lifting mechanism 7 vertically moving the substrate 2, the support part 8 serving as the pedestal supporting the outer peripheral portion of the substrate 2, exhaust ports 9a and 9b for discharging the gas, a gas pipe 10 for introducing the gas into the gas supply part 3 serving as the gas head, a gate valve 11 for introducing/discharging the substrate 2 into/from the chamber 1 and a non-contact thermometer 12 measuring the temperature of the substrate 2. The lifting mechanism 7 has pawls 7a coming into contact with the substrate 2.

In this film deposition system 20, a cleaning gas generator 13 is connected onto the chamber 1.

The chamber 1 is in the form of a box provided with the exhaust ports 9a and 9b on the lower surface thereof. The exhaust port 9a communicates with the second space 202, while the exhaust ports 9b communicate with the first space 201. The exhaust ports 9a and 9b are connected with the pressure regulating parts 80a and 80b serving as decompression means respectively. These pressure regulating parts 80a and 80b regulate the pressure in (decompress) the internal space 200.

The actuator 6 serving as a drive mechanism is provided on the lower surface of the chamber 1. This actuator 6 supports the heating part 4 and the collimator 5.

The support part 8 is formed by a pedestal 82 serving as the body thereof and a contact part 81 connected to the pedestal 82 for coming into contact with the substrate 2.

Figure 2:
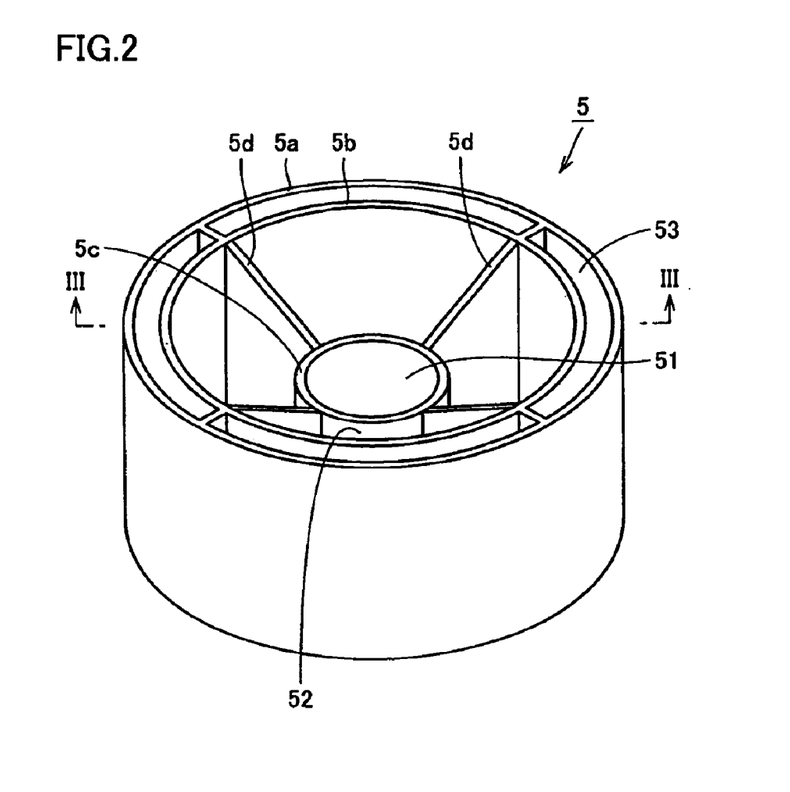
FIG. 2 is a perspective view of a collimator as viewed along arrow II in FIG. 1.
Figure 3:
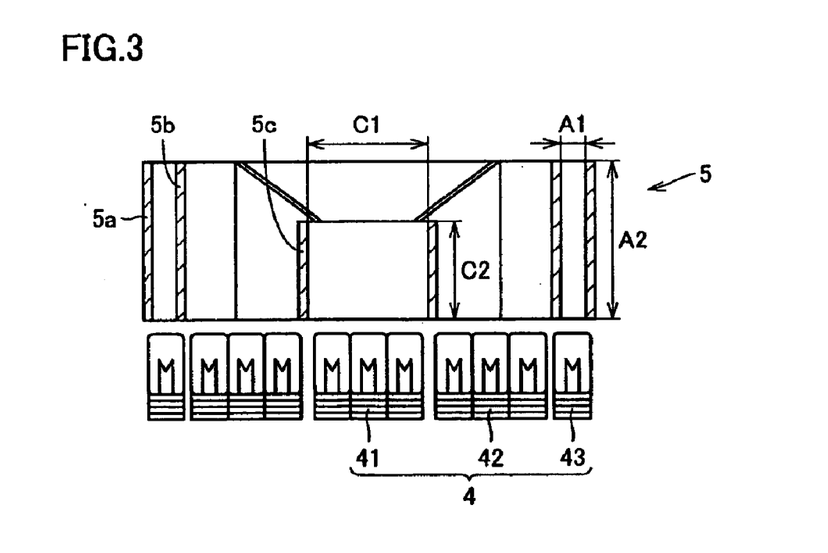
FIG. 3 is a sectional view taken along the line III—III in FIG. 2.

Referring to FIGS. 2 and 3, the collimator 5 has a central portion 51, an intermediate portion 52 and a peripheral portion 53. The central portion 51 having a low aspect ratio C2/C1 can uniformly irradiate light to a wide region. The peripheral portion 53 having a high aspect ratio A2/A1 irradiates light only to the outer peripheral portion of the substrate 2. The intermediate portion 52 located between the central portion 51 and the peripheral portion 53 has an intermediate aspect ratio between those of the central portion 51 and the peripheral portion 53.

Referring to FIG. 3, a light source 41 is provided under the central portion 51. Another light source 42 is provided under the intermediate portion 52. Still another light source 43 is provided under the peripheral portion 53. Temperature reduction in the peripheral portion of the substrate 2 can be corrected by controlling the light sources 41 to 43 in response to the aforementioned sections. Further, extremely uniform temperature distribution can be attained over the entire substrate 2.

In order to compensate for a shadow formed by the collimator 5 itself and nonuniformity of the light sources 41 to 43 formed by lamps constituting the heating part 4, the actuator 6 moves the collimator 5 and the heating part 4 at the same time or independently of each other. In the inventive system of directly heating the substrate 2 with the light sources 41 to 43 without employing heaters, temperature measurement of the substrate 2 is extremely important. According to the present invention, the substrate 2 is so fixed on the support part 8 that the temperature thereof can be measured with a thermocouple or the like.

In the film deposition system 20 according to the first embodiment, the heating part 4 includes the plurality of light sources 41 to 43. The film deposition system 20 further comprises the collimator 5 provided between the light sources 41 to 43 and the substrate 2 for serving as a converging part converging light emitted from the light sources 41 to 43 on the second main surface 2b of the substrate 2. Luminous intensity of each of the plurality of light sources 41 to 43 is adjusted in response to the temperature of the second main surface 2b. The film deposition system 20 further comprises the actuator 6 driving at least either the light sources 41 to 43 or the collimator 5.

A film deposition method employing the film deposition system 20 shown in FIGS. 1 to 3 is now described. First, a transport mechanism (not shown) transports the substrate 2 into the chamber 1 through the gate valve 11, and transfers the same to the lifting mechanism 7. The gate valve 11 is closed when the transport mechanism is out of the chamber 1. The lifting mechanism 7 places the substrate 2 on the support part 8. In this state, the film deposition system 20 keeps the part of the chamber 1 closer to the first main surface 2a of the substrate 2 at the atmospheric pressure or a low pressure of at least 10000 Pa while controlling the other part closer to the second main surface 2b of the substrate 2 to a pressure identical to or lower than that of the part closer to the first main surface 2a at a degree not remarkably deforming the substrate 2. Thus, the film deposition system 20 fixes the substrate 2 on the support part 8.

The heating part 4 formed by halogen lamps or the like irradiates light toward the second main surface 2b o the substrate 2 thereby increasing the temperature of the substrate 2. At this time, the film deposition system 20 passes the beam through the collimator 5 to be capable of controlling the intensity of the beam reaching the second main surface 2b in response to locations, thereby obtaining a uniform temperature over the entire substrate 2. The non-contact thermometer 12 serving as a temperature sensor measures the temperature of the second main surface 2b, and the film deposition system 20 controls power applied to the heating part 4 for obtaining a desired temperature.

Figure 4:
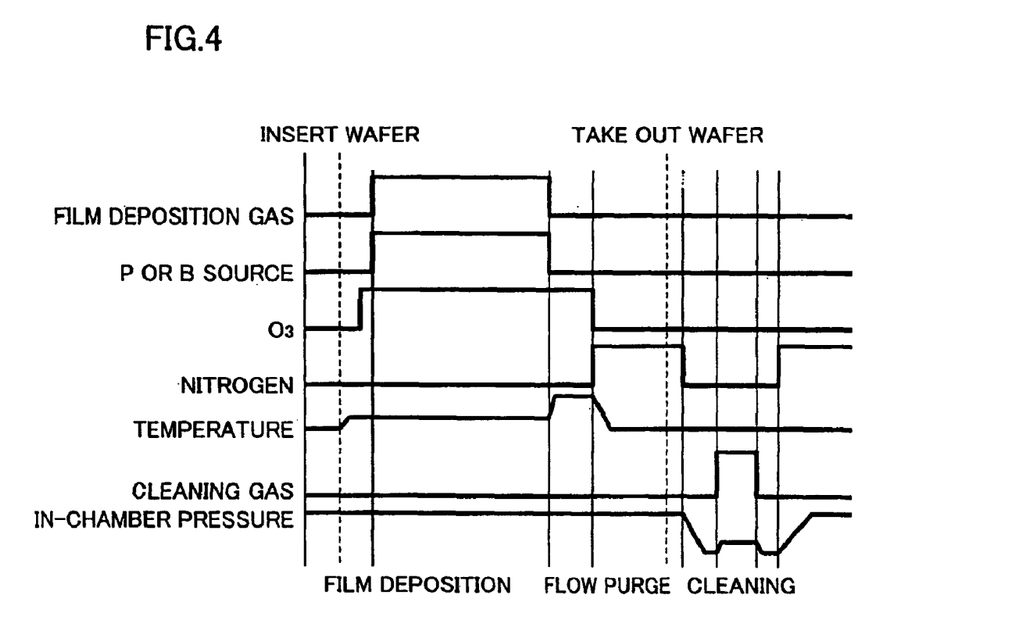
FIG. 4 is a graph showing the state in a chamber employed in a method of fabricating a semiconductor device according to the first embodiment of the present invention.

Referring to FIG. 4 showing the inner part of the chamber 200, "film deposition gas" denotes the flow rate of film deposition gas. "P or B source" denotes the flow rate of gas containing phosphorus or boron. "$O_3$" denotes the flow rate of gas containing ozone. "Nitrogen" denotes the flow rate of nitrogen gas. "Temperature" denotes the temperature of the substrate 2. "Cleaning gas" denotes the flow rate of cleaning gas. This also applies to FIGS. 11, 17 and 21.

When the temperature of the substrate 2 reaches the desired level, the gas supply part 3 sprays the source gas onto the substrate 2. For example, the film deposition system 20 sets the temperature of the substrate 2 to 450° C. while keeping the first main surface 2a at the atmospheric pressure in the upper portion of the chamber 1 and supplies film deposition gas such as TEOS (tetraethyl orthosilicate), TEB (triethyl borate) and TEPO (triethyl phosphate) and ozone from the gas supply part 3 to the surface of the substrate 2 along with carrier gas such as nitrogen, thereby depositing a film of BPSG (borophosphosilicate glass) on the surface of the substrate 2.

After depositing the film, the film deposition system 20 reduces the flow rate of the film deposition gas and increases the pressures of oxygen and ozone so that the gas supply part supplies a gas mixture of oxygen and ozone to the internal space and the heating part 4 heats the substrate 2.

Figure 5:
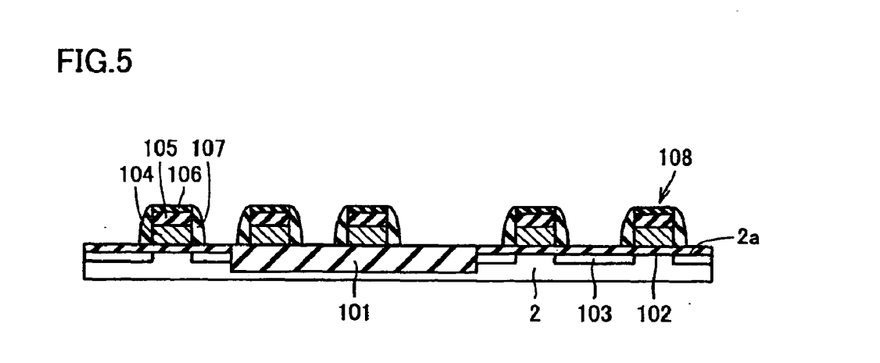
FIGS. 5 to 9 are sectional views showing first to fifth steps of the method of fabricating a semiconductor device according to the first embodiment of the present invention.

A method of fabricating a semiconductor device employing the film deposition system 20 shown in FIG. 1 is now specifically described. Referring to FIG. 5, the substrate (semiconductor substrate) 2 is prepared. This substrate 2 is formed thereon with an isolation oxide film 101, a gate insulator film 102, impurity regions 103, polysilicon layers 104, oxide films 105, nitride films 106 and side wall nitride films 107. Gate electrodes 108 formed as irregularity on the surface of the substrate 2 include the polysilicon layers 104. This substrate 2 is located in the internal space 200 of the film deposition system 20.

Figure 6:
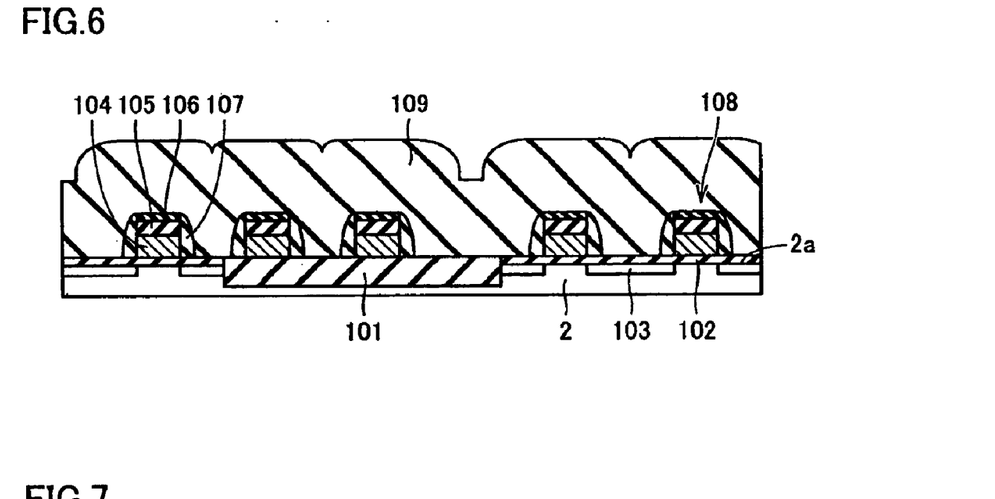

Referring to FIG. 6, an oxide film 109 of BPSG is formed on the substrate 2 in the film deposition system 20. Thereafter the film deposition system 20 rapidly increases the output of the heating part 4 while introducing ozone and oxygen from the gas supply part 3 thereby rapidly increasing the temperature of the substrate 2 to 900° C. and keeping this temperature for 30 seconds. At this time, the oxide film 109 flows due to the temperature and the action of ozone and oxygen.

Figure 7:
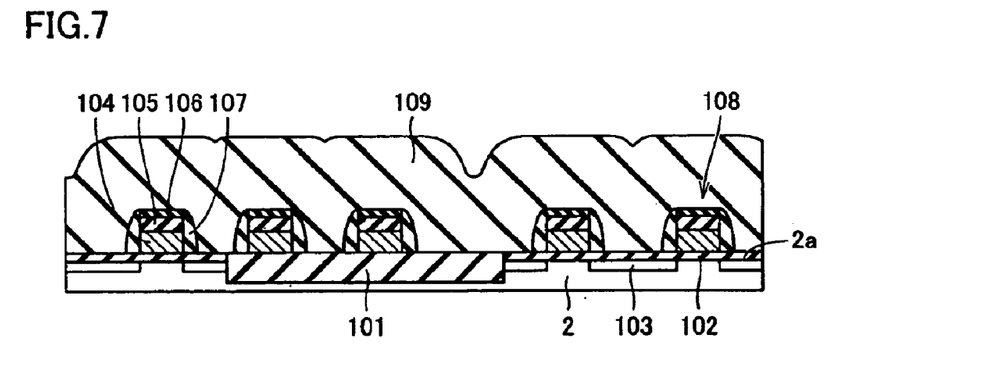

Referring to FIG. 7, the oxide film 109 presents a smooth surface shape. At the same time, moisture and organic materials contained in BPSG desorb thereby improving the quality of the oxide film 109 and stabilizing the etching rate of this portion. Thereafter the film deposition system 20 reduces the output of the heating part 4 while feeding a large quantity of carrier gas such as nitrogen thereby reducing the temperature of the substrate 2. The transport mechanism takes out the substrate 2 from the chamber 1. No voids are formed in the oxide film 109 of BPSG regardless of the pitch of the gate electrodes 108.

Figure 8:
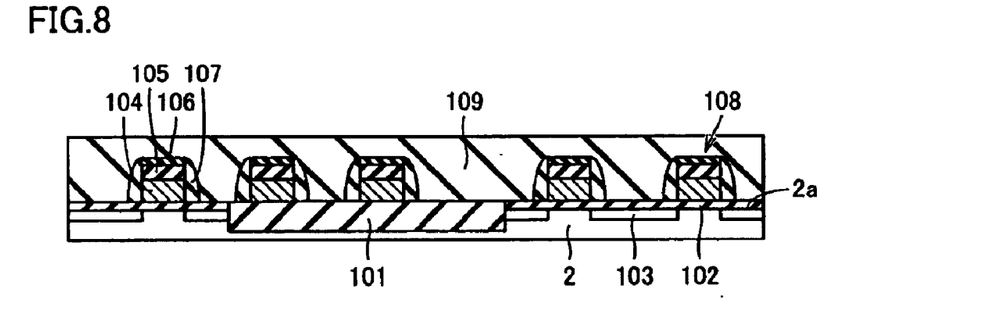

Referring to FIG. 8, CMP treatment is performed for obtaining a flat surface.

Figure 9:
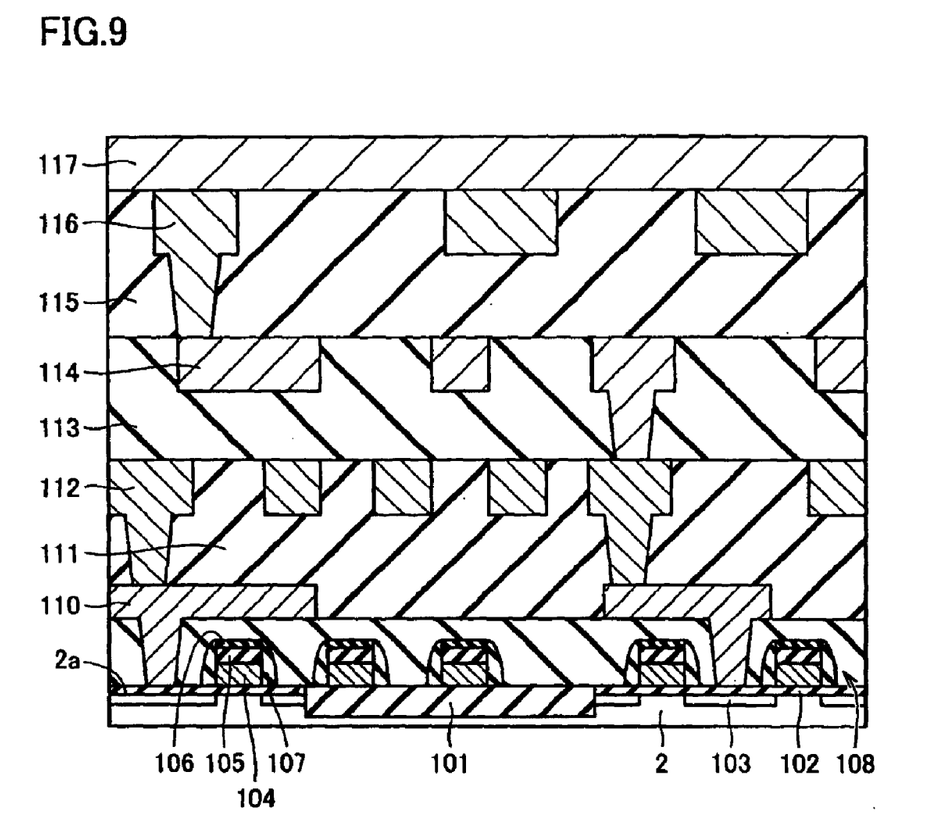

Referring to FIG. 9, first wiring layers 110 are formed on the oxide film 109 serving as a first interlayer dielectric film, and a second oxide film 111 is formed on the first wiring layers 110. The film deposition system 20 shown in FIGS. 1 to 3 deposits the second oxide film 111 and thereafter flattens the surface thereof in the aforementioned manner. Second wiring layers 112 are formed on the flattened surface of the second oxide film 111, and a third oxide film 113 is formed on the second wiring layers 112. The film deposition system 20 shown in FIGS. 1 to 3 also deposits the third oxide film 113 and thereafter flattens the surface thereof. Third wiring layers 114, a fourth oxide film 115, fourth wiring layers 116 and a passivation film 117 are further formed on the third oxide film 113.

Figure 10:
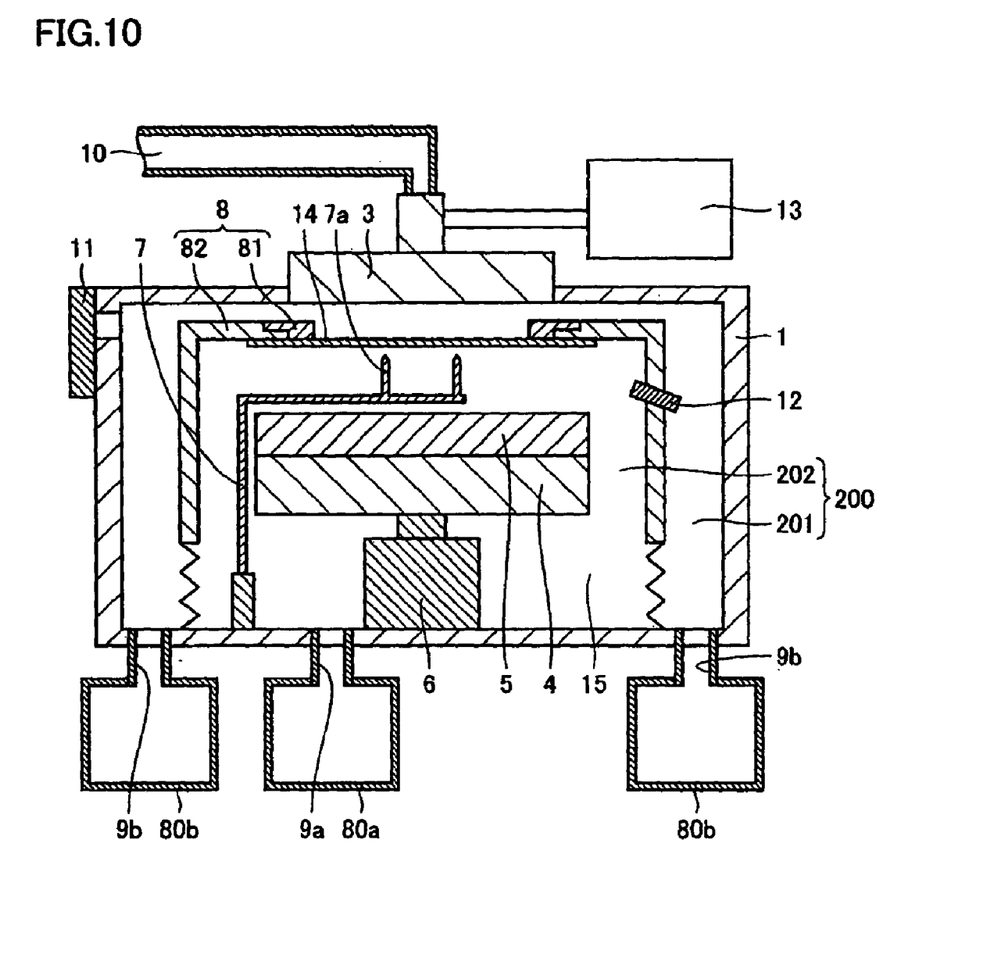
FIG. 10 is a sectional view showing a step of cleaning the chamber.

Referring to FIG. 10, the inner part of the chamber 1 and the like are purged with nitrogen or the like after film deposition, and the substrate 2 is taken out from the chamber 1 while a lamp chamber 15 storing the heating part 4 and the collimator 5 is protected with a lamp protection cover 14 against cleaning gas. The cleaning gas formed by fluorine radicals or the like is introduced into the internal space 200 while decompressing the chamber 1, for removing films from the support part 8 and the gas supply part 3. The cleaning gas in the internal space 200 is replaced with nitrogen, so that the film deposition system 20 can thereafter treat another substrate.

In the aforementioned film deposition system 20 according to the present invention and the method of fabricating a semiconductor device employing the same, the second main surface 2b of the substrate 2 is uniformly heated not by heater but by lamps regardless of warping of the substrate 2. Consequently, a film can be formed with a uniform thickness and uniform impurity concentration over the entire substrate 2. This effect results not only from the lamp heating system but also from the following feature of the present invention:

A lamp-heating type CVD (chemical vapor deposition) system has been proposed also in general. However, the conventional system, having a window for introducing light into a chamber, is disadvantageously unstabilized in film deposition characteristic due to formation of a film on this window. This also applies to a structure arranging lamps around a reaction vessel of transparent quartz or the like such that the film deposition characteristic is unstabilized due to formation of a film on the surface of the reaction vessel of transparent quartz.

While a CVD system heating a second main surface of a substrate directly with lamps without through a window is also known, no uniformity is attained over the entire substrate since this system has neither means for fixing the substrate nor means for uniformly heating the substrate up to the peripheral portion thereof.

According to the present invention, the pressure around the second main surface 2b of the substrate 2 is set below that around the first main surface 2a. Therefore, the outer peripheral portion of the substrate 2 can be fixed onto the support part 8 without providing a mechanism for fixing the substrate 2, so that the substrate 2 can be directly heated through no window. If the pressure in the chamber 1 is low in this state, the source gas disadvantageously diffuses between the substrate 2 and the support part 8 to disadvantageously deposit a film on the second main surface 2b of the substrate 2 and bond the substrate 2 and the support part 8 to each other. When the pressure in the chamber 1 is kept in excess of 10000 Pa, diffusion of the source gas to the second main surface 2b of the substrate 2 is so suppressed that a film can be formed only on the first main surface 2a of the substrate 2. Uniform film formation over the entire substrate 2 can be effectively implemented according to the present invention by providing pressure difference between the lamp chamber 15 and the chamber 1 and keeping the pressure in the chamber 1 in excess of 10000 Pa.

The substrate 2 is placed on the support part 8, which is divided into the contact part 81 made of a transparent material such as quartz for serving as a holding part and the pedestal part 82 made of an opaque material such as alumina. The transparent contact part 81 supports the periphery of the substrate 2, so that the beam reaches the outer peripheral portion and reduction of the temperature is small.

However, the outermost peripheral portion of the substrate 2 is still in contact with the support part 8 despite the aforementioned mechanism, to inevitably result in reduction of the temperature. According to the present invention, the collimator 5 and the heating part 4 are utilized for temperature correction in the peripheral portion of the substrate 2, in order to compensate for temperature reduction resulting from contact with the substrate 2. FIGS. 2 and 3 show the combination of the collimator 5 and the heating part 4. Thus, uniform temperature distribution can be obtained according to the present invention also in a large-diametral substrate readily causing extreme distortion, whereby a film of high quality having extremely high uniformity can be deposited.

Further, the film deposition system 20 can flatten the surface of the oxide film 109 formed on the substrate 2 by holding the oxide film 109 in oxygen or an atmosphere containing oxygen and ozone and heating the substrate 2 in this state. Consequently, the quality of the oxide film 109 can be improved with no voids or the like for obtaining a highly reliable semiconductor device.

According to the present invention, film deposition and heat treatment are continuously carried out with no exposure to the atmosphere, whereby the film quality is not changed by moisture absorption or foreign matter dissimilarly to the conventional process. Therefore, the concentration of boron or phosphorus can be increased beyond that in the conventional process, and excellent flowability can be obtained due to unnecessariness of a cap layer having small impurity concentration required in the conventional process.

This feature is enabled by connecting a CVD system and a lamp heating apparatus with each other for transporting the substrate 2 without exposing the same to the atmosphere. When a film of BPSG is heated, however, large quantities of moisture and organic matter result to fog a light source or a window in a conventional lamp heating apparatus, leading to an unstable temperature. According to the present invention, gas resulting from heat treatment flows toward an exhaust side, not to influence the light sources 41 to 43. Further, the inventive film deposition system 20 directly heats the second main surface 2b of the substrate 2, with no apprehension of fogging of a window with a product. In addition, the single chamber 1 is employed for film deposition and heat treatment, whereby the film deposition system 20 can be miniaturized.

Further, heat treatment employed in the present invention includes rapid heating and rapid cooling, whereby the quantity of heat treatment is small and suitable for refinement of the semiconductor device.

(Second Embodiment)

Figure 11:
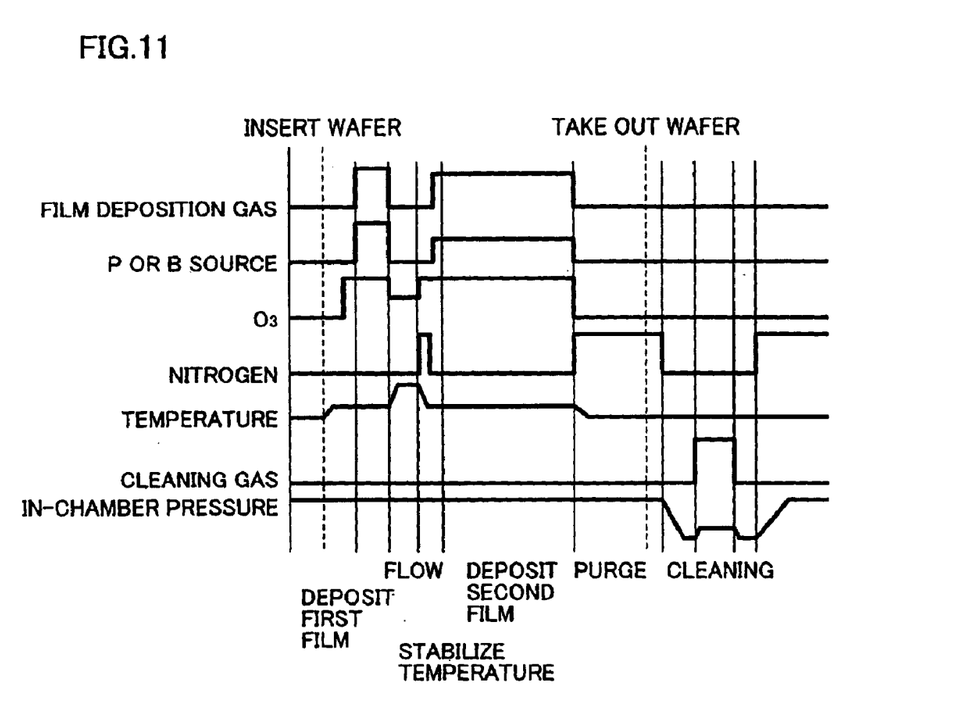
FIG. 11 is a graph showing the state in a chamber employed in a method of fabricating a semiconductor device according to a second embodiment of the present invention.
Figure 12:
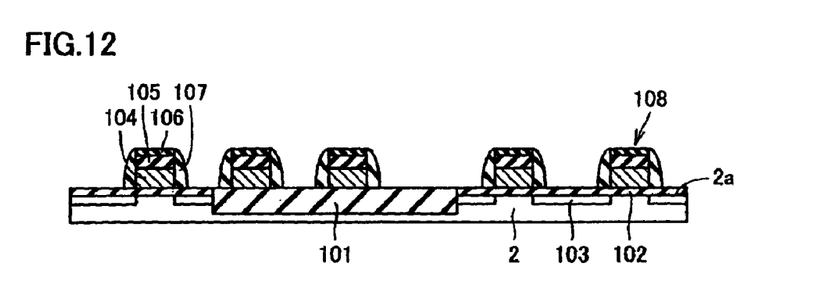
FIGS. 12 to 15 are sectional views showing first to fourth steps of the method of fabricating a semiconductor device according to the second embodiment of the present invention.

Referring to FIGS. 11 and 12, a substrate 2 is prepared in a method of fabricating a semiconductor device according to a second embodiment of the present invention. Gate electrodes 108 are formed on the substrate 2.

Figure 13:
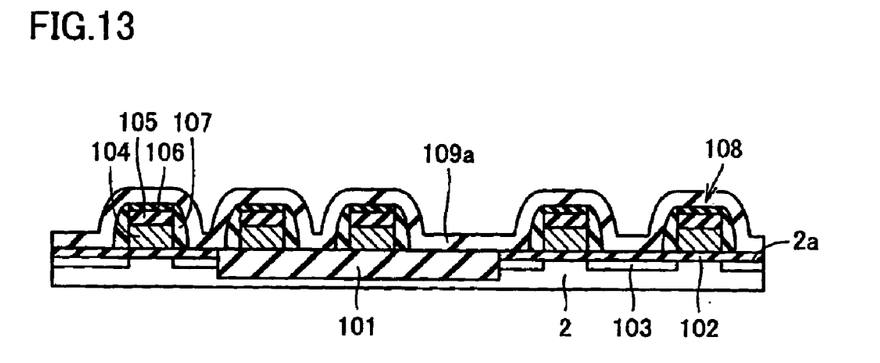

Referring to FIG. 13, a first BPSG film 109a of about 0.1 μm in thickness is formed on the substrate 2 in a film deposition system 20 similar to that according to the first embodiment, in order to closely fill up clearances between the gate electrodes 108 with BPSG.

Figure 14:
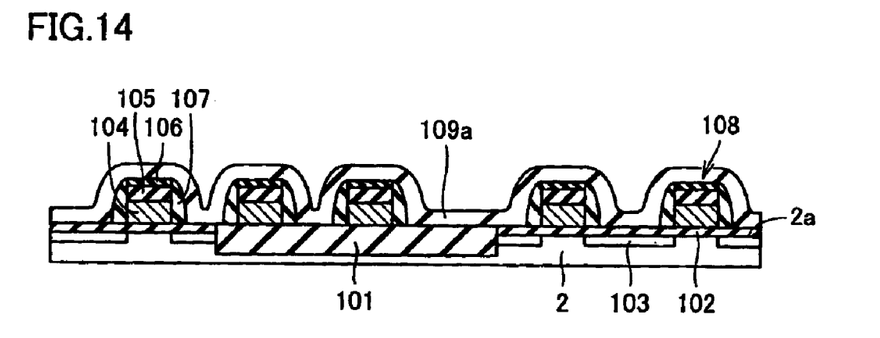

Referring to FIG. 14, the output of a heating part 4 is rapidly increased while feeding ozone and oxygen thereby increasing the temperature of the substrate 2 to 850° C., and the substrate 2 is kept at this temperature for 30 seconds thereby flowing the first BPSG film 109a.

Figure 15:
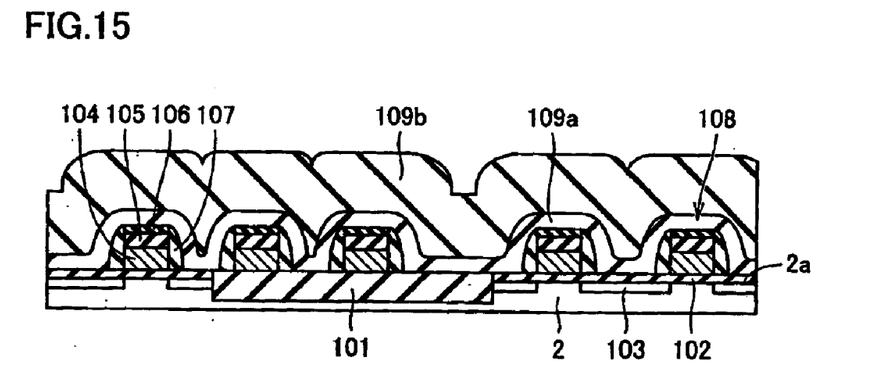

Thereafter carrier gas such as nitrogen is fed similarly to the first embodiment for cooling the substrate 2 to the original temperature while improving the cooling effect by increasing the flow rates of ozone and oxygen. Thereafter film deposition gas is fed again for forming a second oxide film 109b of BPSG for serving as an interlayer dielectric film, as shown in FIG. 15. The second oxide film 109b may be formed under conditions identical to or different from those for the first BPSG film 109a. After the second oxide film 109a reaches a desired thickness, the substrate 2 is taken out from a chamber 1. Then, the substrate 2 is heat-treated by a heat treatment apparatus for flowing the oxide film 109b and improving the film quality.

The second oxide film 109b may alternatively be treated similarly to the first BPSG film 109a to be finally improved in film quality in the film deposition system 20. In this case, second heat treatment may be similar to or different from first heat treatment.

According to this method of fabricating a semiconductor device, heat treatment is performed on the thin first BPSG film 109a in the initial stage of film deposition, thereby improving flowability and effectively performing degassing from the film 109a. Further, film deposition and heat treatment are continuously carried out in the chamber 1, whereby no foreign matter disadvantageous for film deposition and heat treatment results from moisture absorption. Therefore, boron or phosphorus can be added to the first BPSG film 109a with relatively high concentration, thereby attaining remarkably excellent flowability.

The heating part 4 rapidly heats the substrate 2, whereby heat treatment applied to the substrate 2 can be suppressed to the minimum.

(Third Embodiment)

Figure 16:
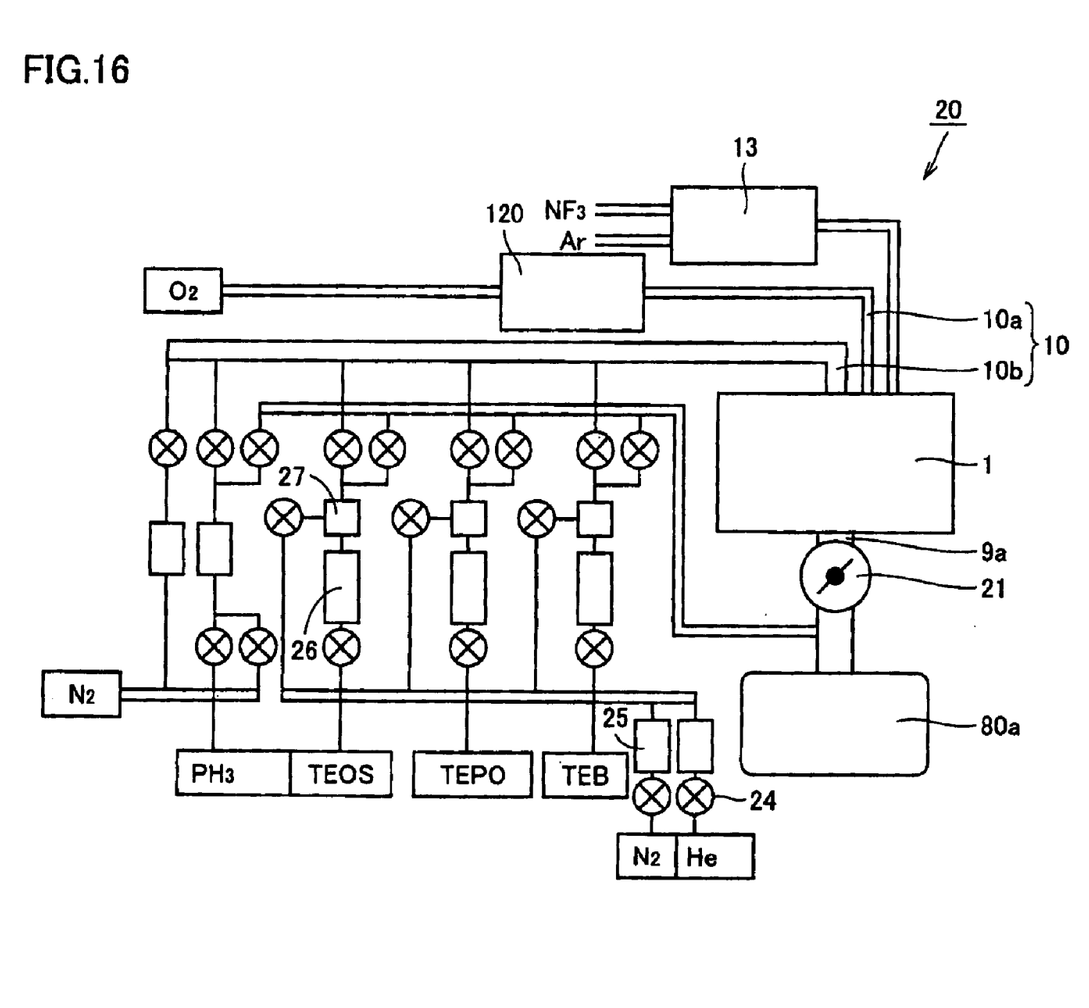
FIG. 16 is a gas system diagram of a film deposition system according to a third embodiment of the present invention.

The film deposition system 20 according to each of the first and second embodiments uses a similar gas system, with no structure related to $PH_3$. A film deposition system according to a third embodiment of the present invention uses relatively stable $PH_3$ in place of TEPO readily reacting with oxygen ($O_2$). Referring to FIG. 16, a chamber 1 is formed similarly to that shown in FIG. 1. A liquid mass flow controller 26 controls the flow rates of TEOS and TEB supplied in the form of liquids. A carburetor 27 gasifies the liquids, which in turn are introduced into the chamber 1 through a gas pipe 10b with a gas mixture of nitrogen and helium. An ozone generator 120 is supplied with oxygen thereby generating ozone, which in turn is supplied to the chamber 1 through a gas pipe 10a. The chamber 1 is exhausted through an exhaust port 9a, which is connected to a pressure regulating part 80a formed by a vacuum pump through a pressure regulating valve 21.

Figure 17:
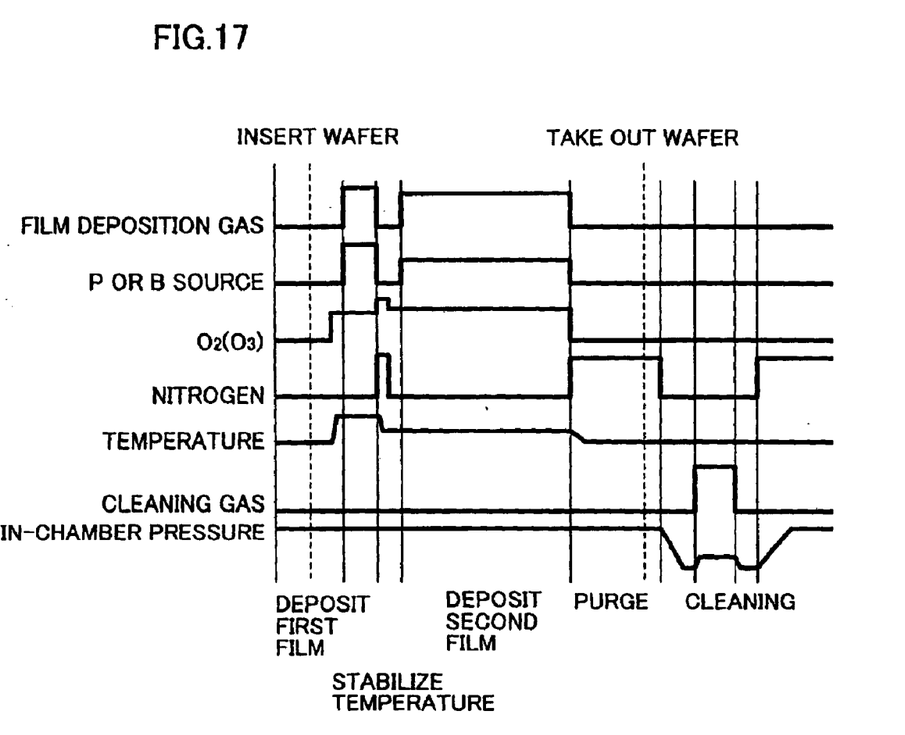
FIG. 17 is a graph showing the state in a chamber employed in a method of fabricating a semiconductor device according to the third embodiment of the present invention.
Figure 18:
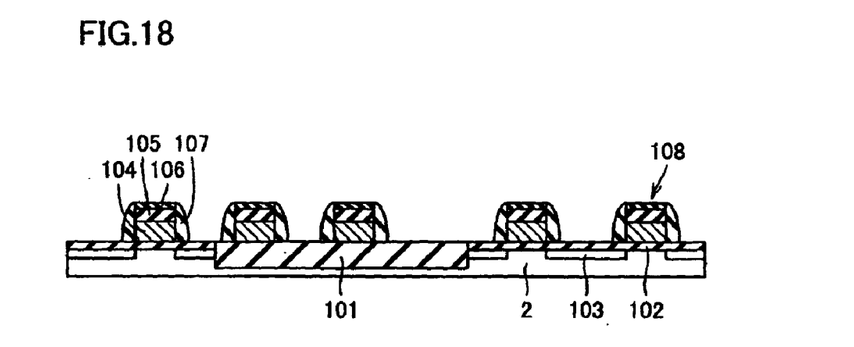
FIGS. 18 to 20 are sectional views showing first to third steps of the method of fabricating a semiconductor device according to the third embodiment of the present invention.

Referring to FIGS. 17 and 18, a substrate 2 is prepared similarly to the first embodiment in a method of fabricating a semiconductor device according to the third embodiment. Gate electrodes 108 are formed on the substrate 2.

Figure 19:
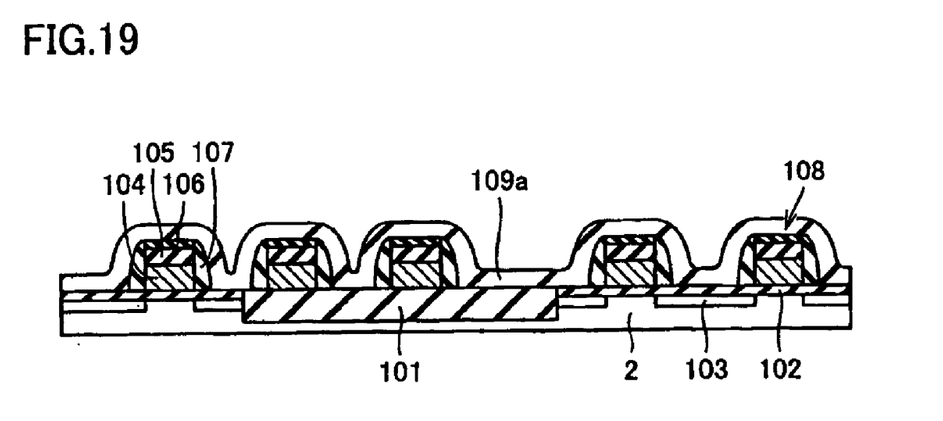

Referring to FIG. 19, the substrate 2 is introduced into the chamber 1 and the temperature thereof is thereafter immediately rapidly increased to 750° C. and kept at this level. Thereafter TEOS, TEB and $PH_3$ are introduced into the chamber 1 with oxygen. In this temperature region, oxidation progresses with no ozone for forming the first BPSG film 109a simultaneously with progress of flowage of the first BPSG film 109a. An excellent finished form is obtained due to simultaneous progress of deposition and flowage of the BPSG film 109a.

Figure 20:
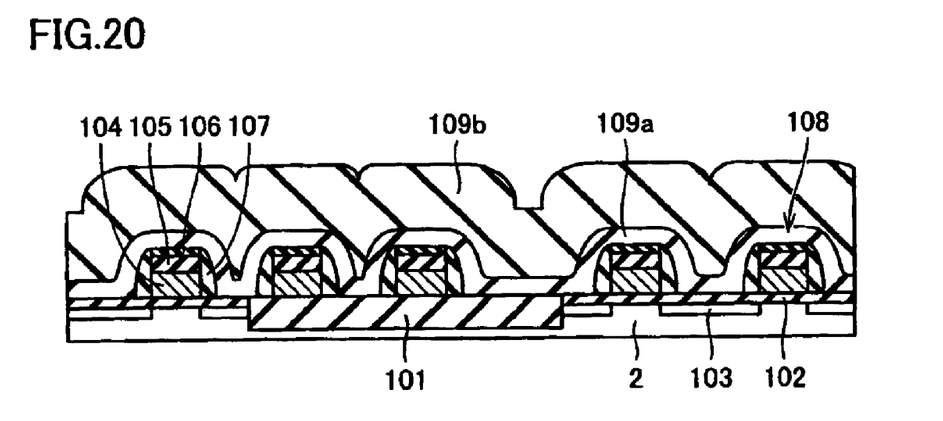

Referring to FIG. 20, the temperature of the substrate 2 is reduced to 450° C. by a method similar to that employed in the second embodiment after the thickness of the first BPSG film 109a reaches about 0.1 μm, for forming the second oxide film 109b.

Figure 21:
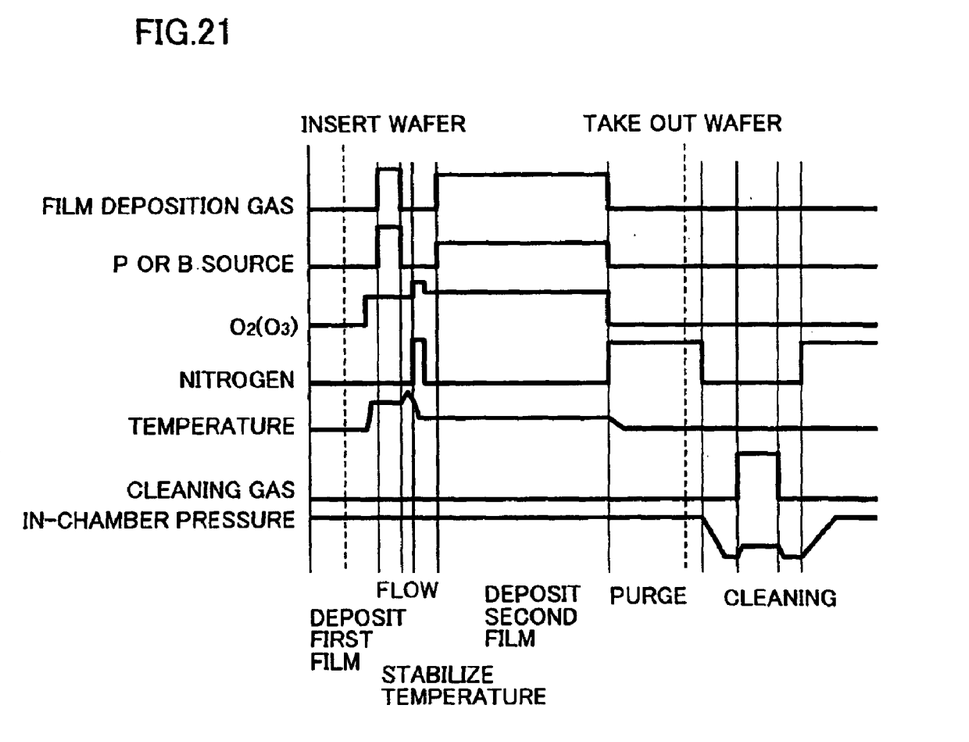
FIG. 21 is a graph showing the state in a chamber employed in another method of fabricating a semiconductor device according to the third embodiment of the present invention.

FIG. 21 is a graph showing the state in a chamber employed in another method of fabricating a semiconductor device according to the third embodiment of the present invention. Referring to FIG. 21, film deposition gas is stopped after formation of a first BPSG film 109a and the temperature is instantaneously increased to 900° C. in this method, thereby attaining further excellent flowability.

This embodiment also attains an effect similar to those of the first and second embodiments.

(Fourth Embodiment)

Figure 22:
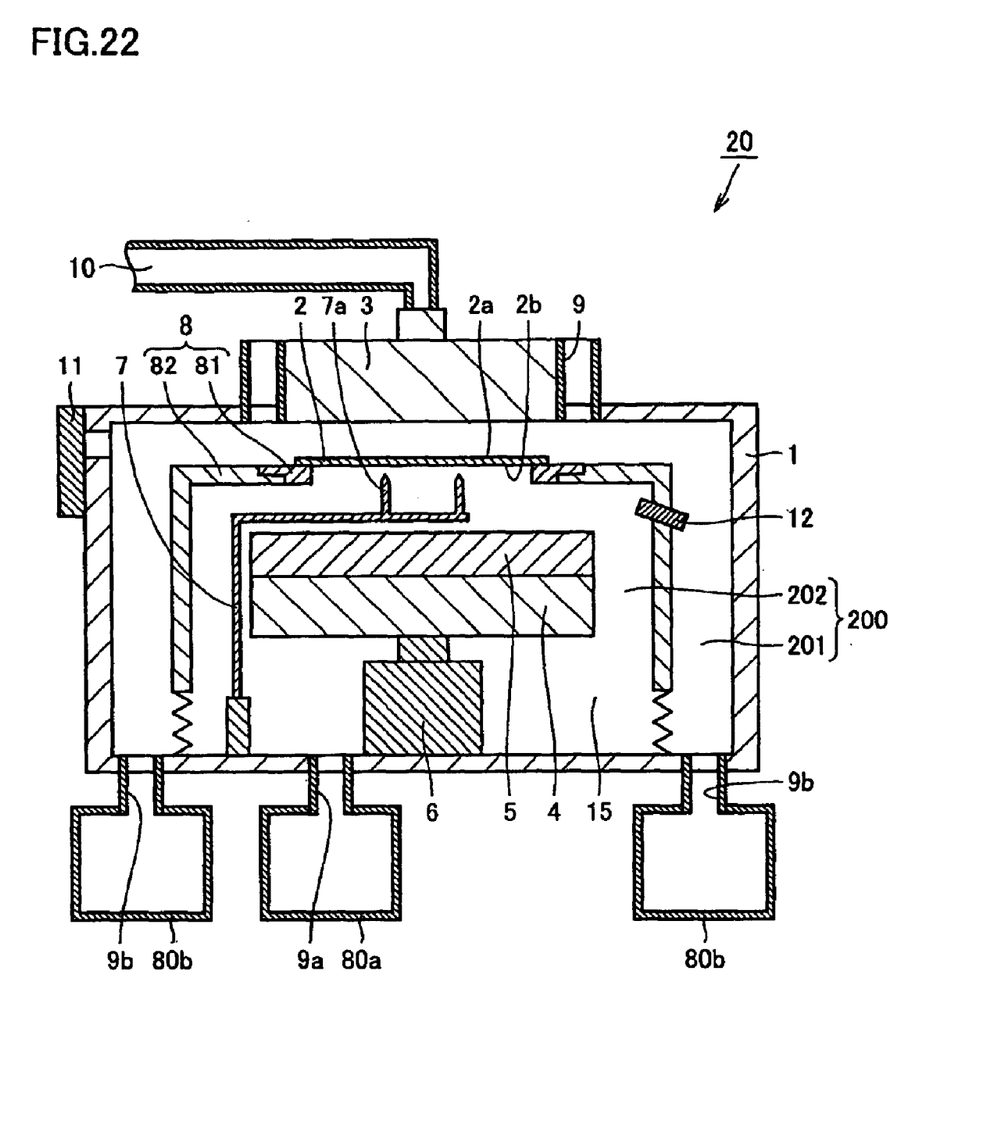
FIG. 22 is a sectional view of a film deposition system according to a fourth embodiment of the present invention.

Referring to FIG. 22, a film deposition system 20 according to a fourth embodiment of the present invention is designed on the premise that the same is used under the ordinary pressure with an exhaust port 9 provided around a gas supply part 3.

This film deposition system 20 attains an effect similar to that of the system 20 according to the first embodiment.

While flow treatment is carried out in oxygen or a mixed atmosphere of oxygen and ozone in each of the first to fourth embodiments of the present invention, heat treatment may alternatively be carried out with inert gas such as nitrogen if oxidation of an underlayer is apprehended. While a BPSG film is deposited in each of the aforementioned embodiments, the present invention is also applicable to a film of PSG (phosphosilicate glass) containing only phosphorus. Further, the used gas is not restricted to those in the aforementioned embodiments either. In addition, the temperatures for film deposition and heat treatment are not restricted to those employed in the aforementioned embodiments.

For example, the step of flowing the oxide film 109 in FIG. 7 or the like can be carried out at a temperature of at least 500° C. and not more than 1000° C. The thickness of the first BPSG film 109a formed in FIG. 13 is preferably not more than 0.3 µm. Referring to FIG. 13, the oxide film 109b can be formed at a temperature of at least 350° C. and not more than 550° C. after forming the first BPSG film 109a at a temperature of at least 650° C. and not more than 900° C.

While the clearances between the gate electrodes 108 are filled up with the oxide film 109 or 109a in each of the aforementioned embodiments, the present invention is also applicable to formation of a silicon oxide film for filling up trenches.

According to the present invention, it is possible to provide a film deposition system capable of uniformly forming an oxide film and reliably flattening the surface thereof also with respect to a large-diametral wafer and a method of fabricating a semiconductor device employing this film deposition system.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A film deposition system comprising:

a chamber having an internal space;

a support part provided in said internal space of said chamber for supporting a substrate having a first main surface formed with a film and a second main surface opposite to said first main surface;

a gas supply part supplying gas to said internal space;

a heating part heating said second main surface of said substrate with a light source; and a pressure regulating part increasing the pressure of a part of said internal space closer to said first main surface beyond the pressure in another part closer to said second main surface for bringing said substrate into close contact with said support part, said support part supporting the outer peripheral portion or the outer peripheral portion and the central portion of said substrate to expose said first main surface and said second main surface in said internal space.

2. The film deposition system according to claim 1, wherein said gas supply part supplies oxygen or a gas mixture of oxygen and ozone to said internal space while said heating part heats said substrate after an oxide film is formed on said substrate.

3. The film deposition system according to claim 1, wherein said pressure regulating part keeps the pressure of said part closer to said first main surface at least 10000 Pa.

4. The film deposition system according to claim 1, wherein said heating part includes a plurality of light sources, said film deposition system further comprising a convergence part provided between said light sources and said substrate for converging light emitted from said light sources on said second main surface of said substrate, for adjusting luminous intensity of each of said plurality of light sources in response to the temperature of said second main surface.

5. The film deposition system according to claim 4, further comprising an actuator driving at least either said light sources or said convergence part.

6. The film deposition system according to claim 4, wherein said light sources are lamps.

7. A method of fabricating a semiconductor method employing the film deposition system according to claim 1, comprising steps of:

forming a first oxide film on a semiconductor substrate having irregularity supported by said support part; and holding said semiconductor substrate formed with said first oxide film in oxygen or a gas mixture atmosphere of oxygen and ozone while heating said semiconductor substrate with said heating part thereby flattening said first oxide film.

8. The method of fabricating a semiconductor device according to claim 7, wherein said step of flattening said first oxide film includes a step of heating said first oxide film to a temperature of at least 500° C. and not more than 1000° C.

9. The method of fabricating a semiconductor device according to claim 7, wherein the thickness of said first oxide film is not more than 0.3 µm, and the method further comprises a step of forming a second oxide film on flattened said first oxide film.

* * * * *